United States Patent [19]

Burrage

[11] Patent Number: 5,162,911
[45] Date of Patent: Nov. 10, 1992

[54] CIRCUIT FOR ADDING R.F. SIGNALS

[75] Inventor: Clement P. Burrage, Essex, United Kingdom

[73] Assignee: GEC-Marconi Limited, Stanmore, United Kingdom

[21] Appl. No.: 727,625

[22] Filed: Jul. 10, 1991

[30] Foreign Application Priority Data

Aug. 17, 1990 [GB] United Kingdom ............... 9018164

[51] Int. Cl.⁵ .................... H04N 5/38; H01P 5/16
[52] U.S. Cl. ................... 358/186; 333/104; 333/115; 333/123
[58] Field of Search ............ 333/103, 104, 109, 111, 333/115, 116, 117, 123; 358/184, 186

[56] References Cited

U.S. PATENT DOCUMENTS

| | | | |
|---|---|---|---|
| 4,375,054 | 2/1983 | Pavio | 333/116 |
| 4,814,780 | 3/1989 | Sterns et al. | 333/111 X |
| 4,999,593 | 3/1991 | Anderson | 333/116 X |

FOREIGN PATENT DOCUMENTS

| | | |
|---|---|---|
| 261001 | 10/1989 | Japan ................... 333/116 |
| 959078 | 5/1964 | United Kingdom . |
| 966629 | 8/1964 | United Kingdom . |
| 2223626A | 4/1990 | United Kingdom . |
| 2227629A | 8/1990 | United Kingdom . |

Primary Examiner—Paul Gensler
Attorney, Agent, or Firm—Lowe, Price, LeBlanc & Becker

[57] ABSTRACT

The circuit is capable of selectively adding r.f. inputs at A, B dependent on the bias voltage applied to varactor diodes D1, D2. In one bias condition of the diodes and hence one value of capacitance, the reactance between A and B and between the output and point D is equal to the reactance of transmission lines 10, 11 formed by co-axial cables, and quadrature inputs at A and B are combined at output O/p. At another value of acpacitance of the varactor diodes, corresponding to another bias voltage, the capacitance of the diodes and the series capacitances C1, C2 resonate with the inductances L1, L2 and input A is effectively isolated from input B. The circuit can be used to produce a power amplified composite video r.f. signal, input A being connected to a power amplifier for the video signal only and input B being connected to a pulse amplifier for the sync pulses only. This permits more efficient use of the amplifiers compared to a single amplifier for amplifying the composite video signal.

15 Claims, 2 Drawing Sheets

COMPOSITE VIDEO
RF SIGNAL

FIG.5
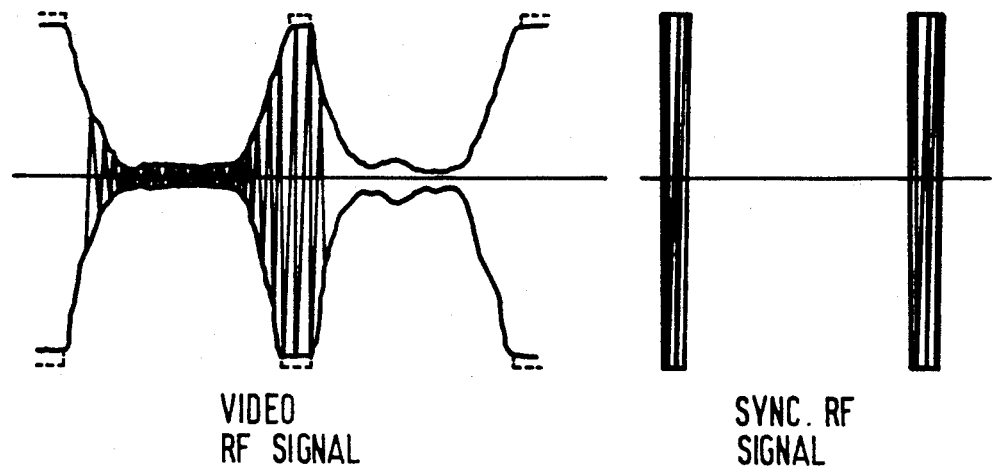
VIDEO
RF SIGNAL
SYNC. RF
SIGNAL
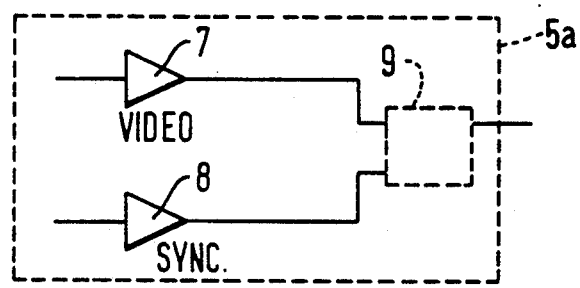
FIG.4
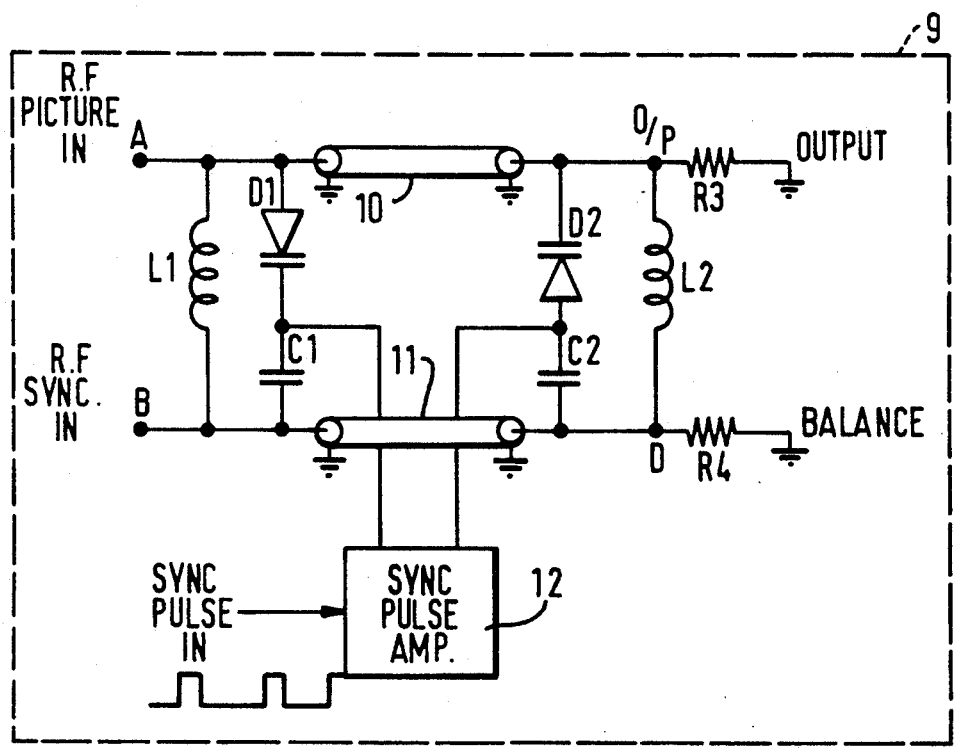
FIG.6

CIRCUIT FOR ADDING R.F. SIGNALS

BACKGROUND OF THE INVENTION

1. Field of the Invention

The present invention relates to radio frequency (r.f.) amplifiers and, more particularly, to television r.f. amplifiers having separate composite video and synchronization (sync) amplification including means for selectively adding the amplified r.f. signal together.

2. Description of the Background Art

Radio frequency (r.f.) power amplification is often performed using a klystron although it is alternatively possible to employ a relatively large number of solid state amplifiers. In either case, the amplifiers must be proportioned to accepted the whole composite video r.f. signal from peak white to sync pulse bottom (FIG. 1), white being represented by zero amplitude, black being represented by approximately 60% of peak amplitude, and the bottom of the sync pulses being represented by the peak amplitude itself. Thus, the picture content is in the bottom half of the power range of the amplifier, with the top being used to provide only sync pulses. This means that the amplifier is only in the upper half of its power range for 7% of the time, which is a very inefficient way to use its overall power capability.

SUMMARY OF THE INVENTION

According to the invention, a circuit selectively adds power amplified r.f. signals together so that the picture and the sync r.f. signals can be amplified separately. This allows the video amplifier to use the whole of its power range for the picture, and the sync amplifier can be made a much smaller device than that required hitherto for the composite video signal since, although its peak output is high, its average power is only 7% of that corresponding to the peak output.

The circuit is based on the known quadrature hybrid circuit shown in FIG. 2. Two r.f. signals in quadrature are fed to inputs A and B, respectively. Inputs A and B are connected to respective lengths of transmission line of 50 ohms characteristic impedance connected to 50 ohm resistors R1, R2, the upper of which (as seen in FIG. 2) forms the output load and the lower of which forms a balance load. The transmission lines TL1, TL2 consist of co-axial cable approximately one eighth of a wavelength in length, the outer sheath of which is earthed. The ends of the transmission line are connected by capacitors C1, C2, whose reactance is 50 ohms. The r.f. inputs appear, added together and in phase, across the output load. Any difference in amplitude of the r.f. input signals is manifested by a voltage across resistor R2, the balance load.

The invention provides a circuit for selectively adding together two r.f. signals which are in quadrature, comprising a first transmission line in a path extending from a first input to an output, a second transmission line in a path extending from a second input, first reactive means in a path connecting the ends of the transmission lines which are nearer to the inputs and second reactive means in a path connecting the other ends of the transmission lines, each reactive means comprising a parallel connection of inductive means and capacitive means, the capacitive means being capable of being switched between one value of capacitance for which the impedance of the paths containing the first and second reactive means is substantially equal to that of the paths containing the transmission lines, so that both inputs added together and in phase appear at the output, and another value of capacitance for which resonance occurs in use with the inductive means and only the r.f. signal applied to the first input appears at the output.

The capacitors of the quadrature hybrid circuit are replaced by a parallel connection of inductive means and capacitive means, and the variation of the capacitive means between two values enables the circuit either to operate in the manner of the quadrature hybrid circuit, or for the first transmission line to be isolated by a very high impedance from the second transmission line and hence the second signal.

Thus, with the adding circuit of the invention, the output of an amplifier for the video signal can be added to the output of a pulse amplifier for the sync pulses, addition taking place only during the period of the sync pulses, and the video signal being isolated from the sync pulse amplifier at all of the times. Of course, the amplifiers feed into a matched load at all times, the impedance of the transmission lines being chosen to be suitable for the amplifiers at the value of r.f. in question.

The capacitive means may be implemented as a varactor diode, which may be switched between the two capacitances desired by switching its bias voltage in synchronism with the sync pulses.

According to the invention, an r.f. power amplifier for amplifying a composite video signal includes a circuit for selectively adding video and sync r.f. signal.

BRIEF DESCRIPTION OF THE DRAWINGS

FIG. 4 is a schematic diagram of one of the amplifiers of FIG. 3;

FIG. 5 illustrates the separated video and sync r.f. signals; and

FIG. 6 is a diagram, partly in block schematic form, of a circuit for adding the outputs of the amplifiers of FIG. 4.

DESCRIPTION OF THE PREFERRED EMBODIMENT

Figure 3:
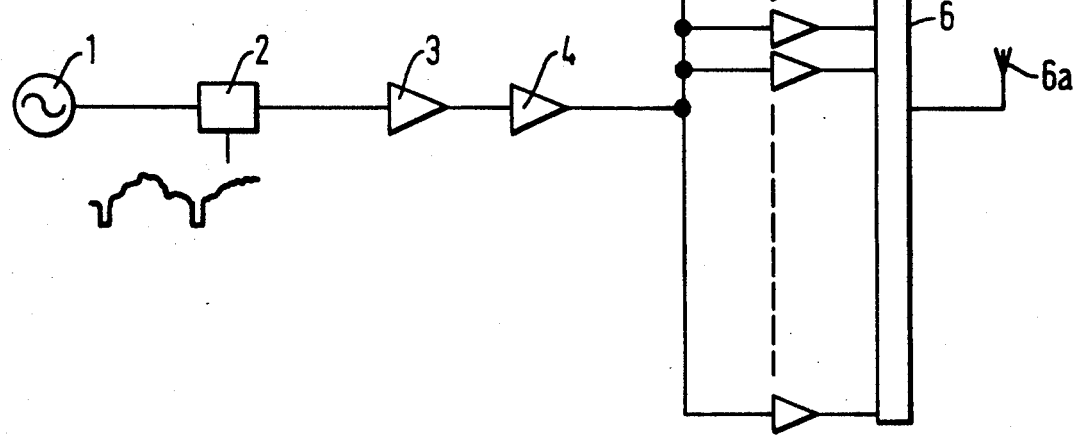
FIG. 3 is a block schematic diagram of a part of a television transmitter.

The television transmitter comprises a UHF carrier wave generator 1 operating in the band IV/V region respectively (470-860 MHz), the signal from which is modulated by a composite video signal in amplitude modulator 2 (FIG. 3), and then pre-amplified from about 1 watt power by pre-amplifiers 3 and 4 to about 20 watts power. The signal is then amplified in a bank of solid state amplifiers 5a, 5b etc, each of which is about 500 watts, and the outputs of which are combined by a combiner 6 into an output of 20 kilowatts, which is fed to a transmitting antenna 6a.

Each of the amplifiers 5a, 5b, etc consists (FIG. 4) of a pair of amplifiers 7, 8, the amplifier 7 being for the video signal and the amplifier 8 being for the sync signal (FIG. 5), which are taken from other parts of the transmitter circuit (not shown). The outputs of the amplifiers 7, 8 are combined in an adding circuit 9, shown in detail in FIG. 6.

Figure 1:
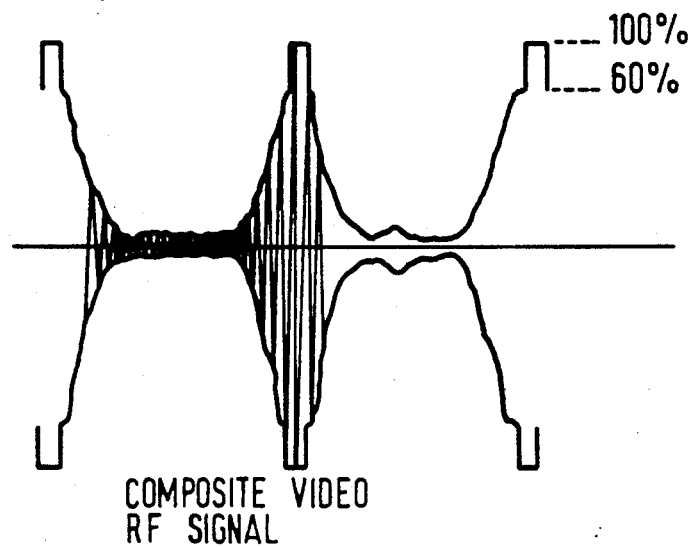
FIG. 1 is a waveform diagram of a composite video r.f. and sync signal.

Amplifier 7 only has to amplify the video signal (FIG. 5), the black level representing 60% of the peak voltage amplitude of the composite video and sync signal shown in FIG. 1, subject to the level during sync pulses being 70% of the peak voltage of FIG. 1 (i.e. 10% beyond the black level) and shown dotted in FIG. 5. Amplifier 8 is a sync pulse amplifier and only has to amplify the sync pulses shown in FIG. 5.

The adding circuit has input A for the output of the video signal amplifier 7 and an input B for the output of the sync pulse amplifier 8. Output 0/p is fed to combiner 6 (FIG. 3), the input impedance of which is shown schematically by resistor R3. The phase of the r.f. vibrations in the sync pulse must lag those in the video signal by 90°, and this is achieved by feeding the output of the sync amplifier to the input B via an appropriate length of co-axial cable.

Co-axial cables 10, 11, one eighth of the r.f. wavelength connect input A to the output O/p and the input B to the balance output D, (which feeds into resistor R4), and reactive means connects inputs A and B output O/p and balance output D. The reactive means comprises inductances L1, L2 in parallel with a series combination of varactor diodes D1, D2 and capacitors C1, C2. The varactor diodes are biassed with an applied voltage from an amplifier 12, which receives sync pulses from preceding stages of the transmitter. The two capacitors C1 and C2 act as low frequency blocks to prevent the sync pulse amplifier output being short circuited by the transmission line 11: the capacitors present a low impedance at r.f. and a high impedance at sync pulse frequencies.

The component values in the circuit 9 and the bias values are chosen so that, during the sync pulses, the varactor diodes assume a higher value of capacitance for which the reactance of the inductor, varactor diode and capacitor combination is equal to the reactance of the transmission line, and of the resistors R3 and R4. In this condition, the circuit functions as a quadrature hybrid circuit and the outputs of the amplifiers 7, 8 appear added together and in phase at the output O/p. To reduce power dissipated in the balance output R4 to a minimum, the voltage amplitude of the sync pulse and of the video signal are made to be approximately equal. This means that the voltage amplitude of the picture signal must be maintained a little beyond black level at around 70% of maximum amplitude of normal composite video signal, rather than 60% which represents black level. If for convenience the picture amplifier is held at black level during the sync pulses, then the sync amplifier output can be adjusted to maintain the correct picture to sync ratio, but the overall efficiency will be slightly less due to a certain amount of sync power being dissipated in the balance load R4.

Between sync pulses, the varactor diodes assume a lower level of capacitance, and parallel resonance takes place between the inductors L1, L2 and the respective series capacitance of D1 and C1, D2 and C2, respectively. This produces an open circuit between input A and input B, and output O/p and output D, so only input A appears at output O/p.

Figure 2:
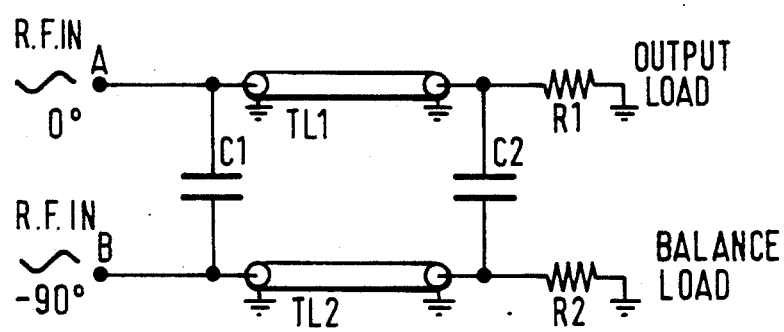
FIG. 2 is a schematic diagram of a quadrature hybrid combiner circuit.

Thus, with the above circuit, amplifier 7 for the video signal will be able to operate over the full range of the video signal, and a simple amplifier can be used for the sync pulses and, at all times, both amplifiers will be matched into appropriate loads. Suitable component values to achieve a load of 50 ohms are as follows: L1, L2 0.12 uH; C1, C2, 1,000 pF; the lengths of the co-axial cable 56.35 mm; R3, R4 50 ohms. This would be appropriate for the center of band IV/V (665 MHz). The values give a bandwidth of 25 MHz for a 1.1 to 1 input vswr. The varactor diodes have a capacitance of 5.25 pF at the sync pulses and a capacitance of 0.5 pF between the sync pulses. The value of the capacitance in parallel with the inductance is slightly higher than for the basic circuit shown in FIG. 2, in order to compensate for the effect of the inductances.

By adjusting the maximum and minimum varactor capacities and the inductor value, the circuit can be made to work over the whole of band IV/V without changing the transmission line length. If problems of variation of varactor capacity during the r.f. cycle are encountered, then each varactor D1, D2 can be replaced by a pair of varactor diodes connected in series but in opposition to each other.

As described above, the varactor diodes are connected in series. However, if desired, they could be connected in parallel e.g. the varactor diode D1 or D2 could be reversed, in which case the sync pulses from the sync pulse amplifier 12 would be fed between the transmission lines 10, 11.

Although the adding circuit has been described in a particular application to television transmitters, it can of course be used for any situation where it is desired to selectively add two r.f. signals.

I claim:

1. A circuit for selectively adding together two r.f. signals which are in quadrature, comprising a first transmission line in a path extending from a first input to an output, a second transmission line in a path extending from a second input, first reactive means in a path connecting the ends of the transmission lines which are nearer to the inputs and second reactive means in a path connecting the other ends of the transmission lines, each reactive means comprising a parallel connection of inductive means and capacitive means, the capacitive means being capable of being switched between one value of capacitance for which the impedance of the paths containing the first and second reactive means is substantially equal to that of the paths containing the transmission lines, so that both inputs added together and in phase appear at the output, and another value of capacitance for which resonance occurs in use with the inductive means and only the r.f. signal applied to the first input appears at the output.

2. A circuit as claimed in claim 1, in which the capacitive means include varactor diodes, and means for varying the bias voltage between two values.

3. A circuit as claimed in claim 2, in which the capacitive means includes a pair of varactor diodes in series but connected in opposition.

4. A circuit as claimed in claim 2, in which the capacitive means includes a d.c. blocking capacitor.

5. A circuit as claimed in claim 1, in which an output of a television video amplifier is connected to the first input, and an output of a television sync pulse amplifier is connected to the second input.

6. A circuit as claimed in claim 5, in which the power of the sync pulse amplifier output and of the video amplifier output are approximately equal during the periods when the outputs are added together.

7. A circuit as claimed in claim 5, in which the circuit forms part of a television r.f. power amplifier, and there are a plurality of video amplifiers and sync amplifiers connected to a plurality of such circuits, the outputs of which are combined in parallel.

8. A television r.f. power amplifier a circuit comprising:

r.f. video amplifier means for amplifying a r.f. video signal and supplying an amplified r.f. video signal;

r.f. sync amplifier means for amplifying a r.f. sync signal and supplying an amplified r.f. sync signal in quadrature with said amplified r.f. video signal; and r.f. combiner means for selectively combining said amplified r.f. video and sync signals, including (i) a first transmission line having an input end connected to receive said amplified r.f. video signals and having an output end;

(ii) a second transmission line having an input end connected to receive said amplified r.f. sync signals and having an output end, (iii) first reactive means connecting said input ends of said first and second transmission lines including a first parallel combination of inductive means and capacitive means, said capacitive means having a value of capacitance responsive to a control signal, (iv) second reactive means connecting said output ends of said first and second transmission lines including a second parallel combination of inductive means and capacitive means, said capacitive means of said second combination having a value of capacitance responsive to said control signal.

9. The television r.f. power amplifier of claim 8 wherein said capacitive means of said first and second parallel combinations are responsive to said control signal for having respective first values of capacitance for which the impedance of said respective parallel combination is substantially equal to values of impedance of said first and second transmission lines whereby said r.f. video and r.f. sync signals are additively combined in phase at an output terminal and second respective values of capacitance whereby substantially only said r.f. video signal is applied to said output terminal.

10. The television r.f. power amplifier of claim 9 further comprising a sync pulse amplifier responsive to a synchronization signal for supplying said control signal to said capacitive means of said first and second reactive means.

11. The television r.f. power amplifier of claim 8 comprising a plurality of said combiner means wherein said r.f. video amplifier means and said r.f. sync amplifier means each comprise a plurality of respective r.f. video amplifiers and r.f. sync amplifiers supplying respective amplified r.f. video and sync signals to respective ones of said plurality of combiner means.

12. An r.f. combiner for selectively combining first and second r.f. signals which are in quadrature, comprising:

a first transmission line having an input end connected to a first input node for receiving said first r.f. signal and an output end connected to a first output node;

a second transmission line having a first input end connected to a second input node for receiving said second r.f. signal and an output end connected to a second output node;

first reactive means connected from said first input node to said second input node and including a first parallel combination of an inductance and a capacitive means having a capacitance responsive to a control signal; and second reactive means connected from said first output node to said second output node and including a second parallel combination of an inductance and a capacitive means having a capacitance responsive to said control signal, whereby, in response to said control signal, said first and second r.f. signals are selectively (i) combined in phase at said first output node and (ii) supplied as separate signals respectively at said first and second output nodes.

13. The r.f. combiner according to claim 12 wherein said capacitance means each include varactor diodes.

14. The r.f. combiner according to claim 13 further comprising control signal generator means for supplying a bias voltage to said varactor diodes in response to a sync signal.

15. The r.f. combiner according to claim 12 includes means for controlling a gain of said amplified r.f. video and sync signals whereby respective power levels thereof are approximately equal.

* * * * *